(12) United States Patent
Daimon et al.

(10) Patent No.: US 11,528,008 B2
(45) Date of Patent: Dec. 13, 2022

(54) ELASTIC WAVE DEVICE

(71) Applicant: Murata Manufacturing Co., Ltd., Nagaokakyo (JP)

(72) Inventors: Katsuya Daimon, Nagaokakyo (JP);
Akira Michigami, Nagaokakyo (JP);
Yasuharu Nakai, Nagaokakyo (JP);
Toshimaro Yoneda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1305 days.

(21) Appl. No.: 15/924,307

(22) Filed: Mar. 19, 2018

(65) Prior Publication Data
US 2018/0287586 A1   Oct. 4, 2018

(30) Foreign Application Priority Data
Apr. 3, 2017   (JP) .............................. JP2017-073399

(51) Int. Cl.
| | |
|---|---|
| *H03H 9/25* | (2006.01) |
| *H03H 9/02* | (2006.01) |
| *H01L 41/187* | (2006.01) |
| *H03H 9/145* | (2006.01) |
| *H01L 41/047* | (2006.01) |
| *H03H 9/64* | (2006.01) |

(52) U.S. Cl.
CPC ............ *H03H 9/25* (2013.01); *H01L 41/0477* (2013.01); *H01L 41/1873* (2013.01); *H03H 9/02559* (2013.01); *H03H 9/14538* (2013.01); *H03H 9/6406* (2013.01)

(58) Field of Classification Search
CPC .. H03H 9/02559; H03H 9/25; H03H 9/14538; H03H 9/02535; H01L 41/0477
USPC ...... 310/313 R, 313 A, 313 B, 313 C, 313 D
See application file for complete search history.

(56) References Cited

U.S. PATENT DOCUMENTS

| | | | |
|---|---|---|---|
| 2007/0132338 A1* | 6/2007 | Nakao ................ | H03H 9/02559 310/313 A |
| 2010/0060101 A1* | 3/2010 | Iwasaki ................ | H03H 9/0222 310/365 |
| 2012/0019102 A1* | 1/2012 | Seki .......................... | H03H 3/10 310/313 C |

(Continued)

FOREIGN PATENT DOCUMENTS

JP   2013-115496 A   6/2013

*Primary Examiner* — Derek J Rosenau
(74) *Attorney, Agent, or Firm* — Keating & Bennett, LLP

(57) ABSTRACT

An elastic wave device includes a piezoelectric substrate, elastic wave resonators on or in the piezoelectric substrate, and a dielectric film disposed on the piezoelectric substrate and covering the elastic wave resonators. The elastic wave resonators includes respective IDT electrodes on the piezoelectric substrate. When a wavelength specified by an electrode finger pitch of the IDT electrode is denoted as λ, at least two of the elastic wave resonators have the different wavelengths. In two of the elastic wave resonators having different wavelengths, a film thickness of the IDT electrode in the elastic wave resonator having the longer wavelength is not greater than that of the IDT electrode in the elastic wave resonator having the shorter wavelength. Film thicknesses of the IDT electrodes in at least two of the elastic wave resonators are different from each other. The elastic wave device utilizes a Rayleigh wave.

13 Claims, 2 Drawing Sheets

(56) References Cited

U.S. PATENT DOCUMENTS

2013/0026881 A1\* 1/2013 Okamoto ............. H03H 9/0222
310/313 C

\* cited by examiner

ELASTIC WAVE DEVICE

CROSS REFERENCE TO RELATED APPLICATIONS

This application claims the benefit of priority to Japanese Patent Application No. 2017-073399 filed on Apr. 3, 2017. The entire contents of this application are hereby incorporated herein by reference.

BACKGROUND OF THE INVENTION

1. Field of the Invention

The present invention relates to an elastic wave device.

2. Description of the Related Art

Elastic wave devices have been widely used in filters of cellular phones and other suitable devices. Japanese Unexamined Patent Application Publication No. 2013-115496 discloses an elastic wave device including two resonators having different resonant frequencies. Film thicknesses of IDT (interdigital transducer) electrodes in the two resonators are set to different sizes. More specifically, the film thickness of the IDT electrode in the resonator in which a period length, i.e., a wavelength λ, of the IDT electrode is relatively short and a resonant frequency is positioned on the higher frequency side, is smaller than that of the IDT electrode in the resonator in which a period length, i.e., a wavelength λ, of the IDT electrode is relatively long and a resonant frequency is positioned on the lower frequency side.

Japanese Unexamined Patent Application Publication No. 2013-115496 states that frequency fluctuations caused by temperature changes can be suppressed with the above-described feature. However, Japanese Unexamined Patent Application Publication No. 2013-115496 does not include any suggestion regarding an elastic wave device in which degradation of frequency characteristics caused by an unwanted wave is suppressed sufficiently.

SUMMARY OF THE INVENTION

Preferred embodiments of the present invention provide elastic wave devices capable of effectively reducing or preventing an unwanted wave.

According to a preferred embodiment of the present invention, an elastic wave device includes a piezoelectric substrate, a plurality of elastic wave resonators provided on or in the piezoelectric substrate, and a dielectric film disposed on the piezoelectric substrate and covering the plurality of elastic wave resonators. The plurality of elastic wave resonators include respective IDT electrodes disposed on the piezoelectric substrate. When a wavelength specified by an electrode finger pitch of the IDT electrode is denoted as λ, the plurality of elastic wave resonators include at least two elastic wave resonators having different wavelengths λ. In two of the plurality of elastic wave resonators having the different wavelengths λ, a film thickness of the IDT electrode in the elastic wave resonator having the longer wavelength λ is equal to or smaller than a film thickness of the IDT electrode in the elastic wave resonator having the shorter wavelength λ. Film thicknesses of the IDT electrodes in at least two among the plurality of elastic wave resonators are different from each other. The elastic wave device utilizes a Rayleigh wave.

In an elastic wave device according to a preferred embodiment of the present invention, in the two elastic wave resonators having the different wavelengths λ, the film thickness of the IDT electrode in the elastic wave resonator having the longer wavelength λ is smaller than the film thickness of the IDT electrode in the elastic wave resonator having the shorter wavelength λ. In this case, an unwanted wave is more effectively reduced or prevented.

In an elastic wave device according to a preferred embodiment of the present invention, the plurality of elastic wave resonators include a first elastic wave resonator having the wavelength λ that is longest among the plurality of elastic wave resonators and a second elastic wave resonator having the wavelength λ that is shortest among the plurality of elastic wave resonators; when the film thickness of the IDT electrode is denoted as t, a function of a band width ratio of an unwanted wave with respect to the film thickness t of the first elastic wave resonator is denoted as a function F1(t) having a local minimum value, and a function of the band width ratio of the unwanted wave with respect to the film thickness t of the second elastic wave resonator is denoted as a function F2(t) having a local minimum value; the function F1(t) has a minimum value F1(t1) at t=t1 in the first elastic wave resonator, and the function F2(t) has a minimum value F2(t2) at t=t2 in the second elastic wave resonator; F1(tj)=F2(tj) is maintained at t=tj in the first elastic wave resonator and the second elastic wave resonator; and when, in the first elastic wave resonator, the film thickness of the IDT electrode at which a value of the function F1(t) is the same as a value of F1(tj) and t<t1 is maintained is denoted by tα, and that, in the second elastic wave resonator, the film thickness of the IDT electrode at which a value of the function F2(t) is the same as a value of F2(tj) and t2<t is maintained is denoted by tβ, the film thickness of the IDT electrode satisfies tα≤tj in the first elastic wave resonator and tj<t≤β in the second elastic wave resonator. In this case, an unwanted wave is more effectively reduced or prevented.

In an elastic wave device according to a preferred embodiment of the present invention, the dielectric film includes silicon oxide as a main ingredient.

In an elastic wave device according to a preferred embodiment of the present invention, the dielectric film is a first dielectric film, and a second dielectric film is disposed on the first dielectric film. In this case, moisture resistance is increased.

In an elastic wave device according to a preferred embodiment of the present invention, the piezoelectric substrate is made of $LiNbO_3$.

With the preferred embodiments of the present invention, elastic wave devices capable of effectively reducing or preventing the unwanted wave are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings.

It is to be noted that the preferred embodiments described in this specification are merely illustrative and individual features and components described below may be partially replaced or combined with each other between the different preferred embodiments.

Figure 1:
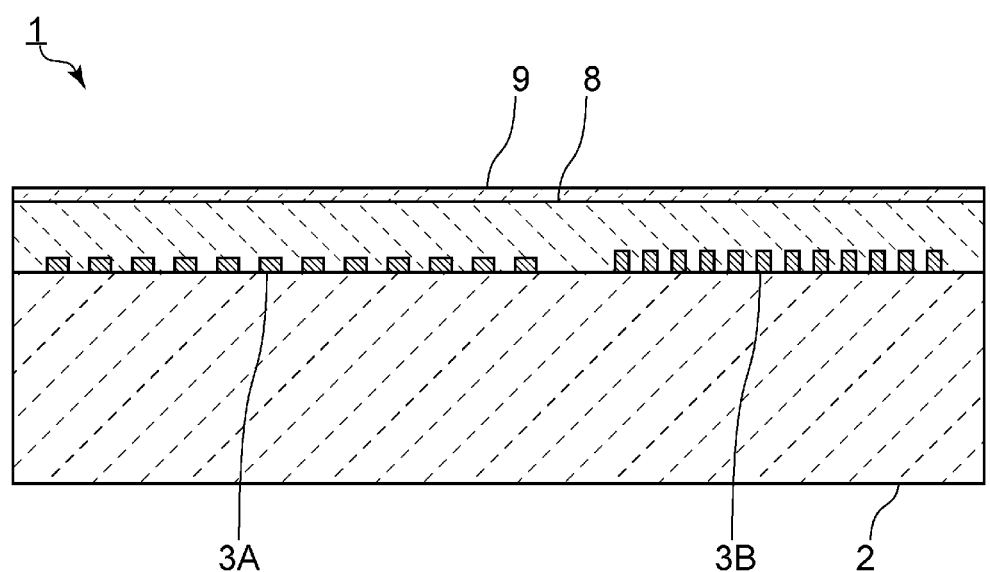
FIG. 1 is a front sectional view of an elastic wave device according to a first preferred embodiment of the present invention.

FIG. 1 is a front sectional view of an elastic wave device according to a first preferred embodiment of the present invention.

The elastic wave device 1 includes, as a substrate with piezoelectric properties, a piezoelectric substrate 2. In the present preferred embodiment, the piezoelectric substrate 2 is made of a piezoelectric single crystal. More specifically, in the elastic wave device 1, a 126° to 130° Y cut λSAW propagation LiNbO$_3$, for example, is preferably used as the piezoelectric substrate 2 though not limited to such an example. Here, the range of cut angle preferably includes 126° and 130°, for example. A piezoelectric substrate including a piezoelectric film laminated on a support substrate may also be used in the elastic wave device 1. The piezoelectric single crystal, for example, may be used as the piezoelectric film wherever appropriate.

A first elastic wave resonator 3A and a second elastic wave resonator 3B are provided on or in the piezoelectric substrate 2. The first elastic wave resonator 3A and the second elastic wave resonator 3B are located adjacent to each other. A positional relationship between the first elastic wave resonator 3A and the second elastic wave resonator 3B is not limited to such an adjacent relationship. The elastic wave device 1 includes, in addition to the first elastic wave resonator 3A and the second elastic wave resonator 3B, a plurality of elastic wave resonators provided on or in the piezoelectric substrate 2 though not illustrated in FIG. 1. The elastic wave device 1 preferably includes at least the first elastic wave resonator 3A and the second elastic wave resonator 3B.

Figure 2:
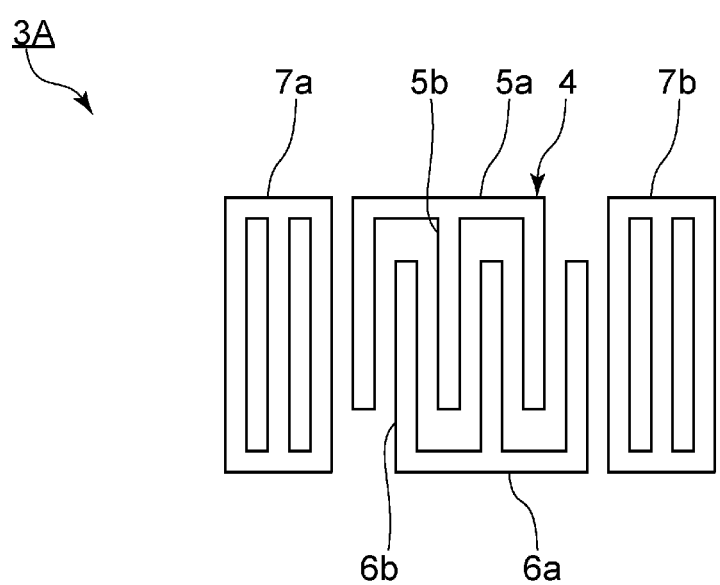
FIG. 2 is a schematic plan view illustrating an electrode structure of a first elastic wave resonator in the first preferred embodiment of the present invention.

FIG. 2 is a schematic plan view illustrating an electrode structure of the first elastic wave resonator 3A in the first preferred embodiment of the present invention. In FIG. 2, wirings connected to the elastic wave resonators are omitted.

The first elastic wave resonator 3A includes an IDT electrode 4 provided on the piezoelectric substrate. The IDT electrode 4 includes a first busbar 5a and a second busbar 6a opposing each other. The IDT electrode 4 includes a plurality of first electrode fingers 5b with first ends connected to the first busbar 5a. The IDT electrode 4 further includes a plurality of second electrode fingers 6b with first ends connected to the second busbar 6a. The first electrode fingers 5b and the second electrode fingers 6b are interdigitated with each other.

When an AC voltage is applied to the IDT electrode 4, an elastic wave is generated. In the present preferred embodiment, the elastic wave device 1 preferably utilizes a Rayleigh wave, for example, as the elastic wave. In this case, an unwanted wave is an SH (Shear Horizontal) wave. A reflector 7a and a reflector 7b are respectively provided on both sides of the IDT electrode 4 in a propagation direction of the elastic wave.

The IDT electrode 4, the reflector 7a, and the reflector 7b may be made of a multilayer metal film including a plurality of metal layers that are laminated, or a metal film including a single layer. In the present preferred embodiment, the IDT electrode 4, the reflector 7a, and the reflector 7b are preferably made of Pt, for example.

Each of the elastic wave resonators other than the first elastic wave resonator 3A also includes the IDT electrode and the reflectors. In the present preferred embodiment, the IDT electrode in each of the elastic wave resonators including the first elastic wave resonator 3A preferably has a duty ratio of about 0.5, for example.

A wavelength specified by an electrode finger pitch of the IDT electrode is denoted as λ. The wavelength λ of the first elastic wave resonator 3A illustrated in FIG. 1 is longest among the plurality of elastic wave resonators. The wavelength λ of the second elastic wave resonator 3B is shortest among the plurality of elastic wave resonators. However, the wavelength λ need only be different between at least two of the plurality of elastic wave resonators.

In the present preferred embodiment, in two elastic wave resonators having the different wavelengths λ, preferably, a film thickness of the IDT electrode in the elastic wave resonator having the longer wavelength λ is smaller than that of the IDT electrode in the elastic wave resonator having the shorter wavelength λ, or equal to that of the IDT electrode in the elastic wave resonator having the shorter wavelength λ. In addition, in the present preferred embodiment, the film thicknesses of the IDT electrodes in at least two of the plurality of elastic wave resonators are different from each other. Thus, at least, a film thickness of the IDT electrode 4 in the first elastic wave resonator 3A having the longest wavelength λ is smaller than that of the IDT electrode in the second elastic wave resonator 3B having the shortest wavelength λ.

As illustrated in FIG. 1, a first dielectric film 8 is disposed on the piezoelectric substrate 2 and covers the first elastic wave resonator 3A, the second elastic wave resonator 3B, and the other elastic wave resonators. The first dielectric film preferably includes silicon oxide, for example, as a main ingredient. In this specification, the expression "includes . . . as a main ingredient" means that the film includes the relevant material at about 50% by weight or more, for example. The silicon oxide is expressed by SiO$_x$ (x is an integer). In the present preferred embodiment, the first dielectric film 8 is preferably made of SiO$_2$, for example.

A second dielectric film 9 is disposed on the first dielectric film 8. The second dielectric film 9 preferably includes SiN, for example, as a main ingredient. For example, moisture resistance is able to be increased by providing the second dielectric film 9. Materials of the second dielectric film 9 are not limited to the above-described example. As an alternative, the second dielectric film 9 may be omitted.

In the elastic wave device 1, for example, the first dielectric film 8 preferably has a film thickness of about 650 nm, and the second dielectric film 9 preferably has a film thickness of about 20 nm. The film thicknesses of the first dielectric film 8 and the second dielectric film 9 are not limited to the above-described values.

The present preferred embodiment preferably includes the following features. In two elastic wave resonators having different wavelengths λ, a film thickness of the IDT electrode in the elastic wave resonator having the longer wavelength λ is equal to or smaller than that of the IDT electrode in the elastic wave resonator having the shorter wavelength λ. The film thicknesses of the IDT electrodes in at least two of the plurality of elastic wave resonators are different from each other. With these two features, the unwanted wave is effectively reduced or prevented. This point will be described in more detail below.

Relationships among the wavelength λ, the film thickness of the IDT electrode, and a band width ratio of the unwanted wave in the elastic wave resonator were determined under the following conditions. The unwanted wave was assumed to be the SH wave.

Piezoelectric Substrate: material $LiNbO_3$ and cut angle about 127°

IDT Electrode; material Pt, film thickness about 25 nm or more and about 50 nm or less, and duty ratio about 0.5

First Dielectric Film; material $SiO_2$ and film thickness about 650 nm

Second Dielectric Film; material SiN and film thickness about 20 nm

Wavelength λ; about 1.5 μm, about 1.6 μm, about 1.7 μm, and about 1.8 μm

Figure 3:
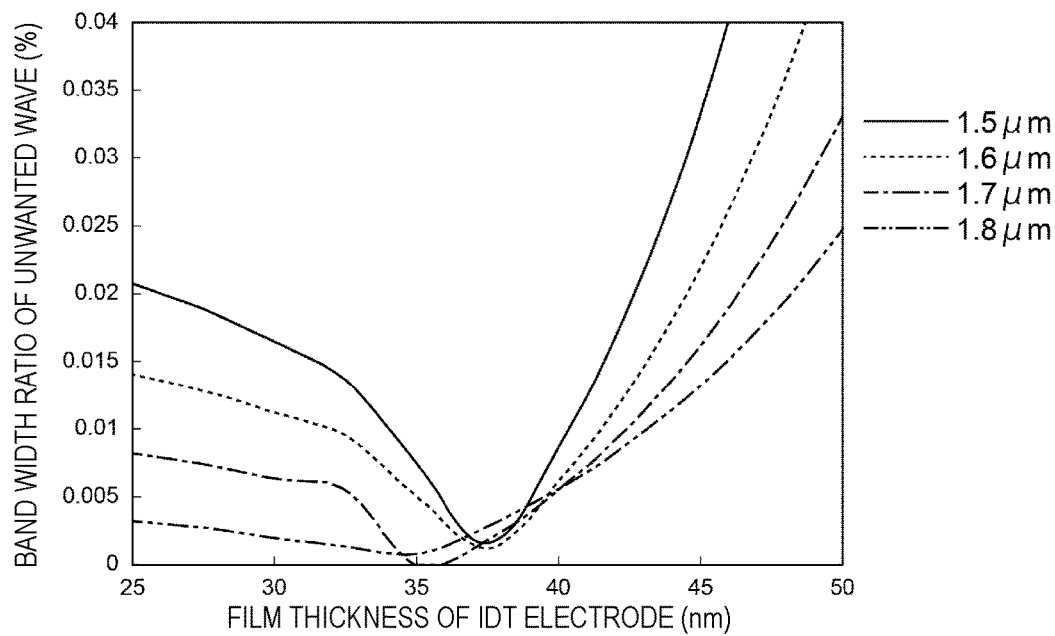
FIG. 3 is a graph representing relationships among a wavelength λ, a film thickness of an IDT electrode, and a band width ratio of an unwanted wave in the elastic wave resonator.

FIG. 3 is a graph representing relationships among the wavelength λ, the film thickness of the IDT electrode, and the band width ratio of the unwanted wave in the elastic wave resonator. In FIG. 3, a solid line represents the result when the wavelength λ is about 1.5 μm. A dotted line represents the result when the wavelength λ is about 1.6 μm. A one-dot-chain line represents the result when the wavelength λ is about 1.7 μm. A two-dot-chain line represents the result when the wavelength λ is about 1.8 μm.

As shown in FIG. 3, when the wavelength λ is relatively short, i.e., about 1.5 μm, the band width ratio of the unwanted wave is minimal at the film thickness of the IDT electrode of about 37.5 nm. On the other hand, when the wavelength λ is relatively long, i.e., about 1.8 μm, the band width ratio of the unwanted wave is minimal at the film thickness of the IDT electrode of about 35 nm. Thus, it is understood that the film thickness of the IDT electrode at which the band width ratio of the unwanted wave is reduced is smaller at the longer wavelength λ.

In the present preferred embodiment, since the film thickness of the IDT electrode in the first elastic wave resonator having the longer wavelength λ is smaller than that of the IDT electrode in the second elastic wave resonator having the shorter wavelength λ, the unwanted wave is effectively reduced or prevented.

Preferably, in two elastic wave resonators having the different wavelengths λ, the film thickness of the IDT electrode in the elastic wave resonator having the longer wavelength λ is smaller than that of the IDT electrode in the elastic wave resonator having the shorter wavelength λ. In this case, the unwanted wave is effectively reduced or prevented in all of the elastic wave resonators of the elastic wave device 1.

An elastic wave device according to a second preferred embodiment of the present invention will be described below.

In the second preferred embodiment, ranges of the film thicknesses of the IDT electrodes in the first elastic wave resonator and the second elastic wave resonator are different from those in the first preferred embodiment. In the other points, the elastic wave device according to the second preferred embodiment has the same or substantially the same configuration as that of the elastic wave device 1 according to the first preferred embodiment illustrated in FIG. 1.

Figure 4:
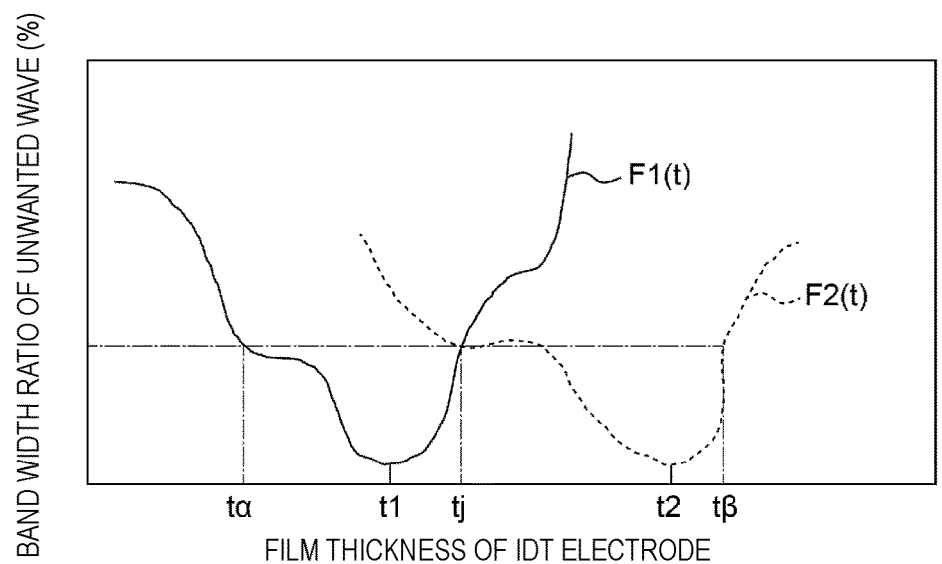
FIG. 4 is a graph representing a relationship between each of film thicknesses of IDT electrodes in first and second elastic wave resonators and a band width ratio of an unwanted wave in a second preferred embodiment of the present invention.

FIG. 4 is a graph representing a relationship between each of the film thicknesses of the IDT electrodes in the first and second elastic wave resonators and a band width ratio of an unwanted wave in the second preferred embodiment. In FIG. 4, a solid line represents the result obtained with the first elastic wave resonator, and a dotted line represents the result obtained with the second elastic wave resonator.

In the present preferred embodiment, when the film thickness of the IDT electrode is denoted as t, a function of the band width ratio of the unwanted wave with respect to the film thickness t of the first elastic wave resonator is denoted as a function F1(t) illustrated in FIG. 4. A function of the band width ratio of the unwanted wave with respect to the film thickness t of the second elastic wave resonator is denoted as a function F2(t). The function F1(t) and the function F2(t) have local minimum values. The function F1(t) and the function F2(t) illustrated in FIG. 4 are merely examples, and they are not limited to particular ones insofar as having local minimum values.

In the first elastic wave resonator, the function F1(t) has a minimum value F1(t) at t=t1. In the second elastic wave resonator, the function F2(t) has a minimum value F2(t2) at t=t2. On the other hand, in the first elastic wave resonator and the second elastic wave resonator, F1(tj)=F2(tj) is maintained at t=tj.

Here, when, in the first elastic wave resonator, the film thickness of the IDT electrode at which a value of the function F1(t) of the band width ratio of the unwanted wave is the same as that of F1(tj) and t<t1 is maintained is denoted by tα. Further, when, in the second elastic wave resonator, the film thickness of the IDT electrode at which a value of the function F2(t) of the band width ratio of the unwanted wave is the same as that of F2(tj) and t2<t is maintained is denoted by tβ. In this preferred embodiment, the film thickness of the IDT electrode satisfies tα≤t<tj in the first elastic wave resonator and tj<t≤tβ in the second elastic wave resonator.

It is shown in FIG. 4 that, when the film thicknesses of the IDT electrodes in the first elastic wave resonator and the second elastic wave resonator fall within the above-described respective ranges, the band width ratio of the unwanted wave is small in each resonator. Thus, the unwanted wave is more effectively reduced or prevented in the present preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   a plurality of elastic wave resonators provided on or in the piezoelectric substrate; and
   a dielectric film disposed on the piezoelectric substrate and covering the plurality of elastic wave resonators;
   wherein
   the plurality of elastic wave resonators include respective IDT electrodes disposed on the piezoelectric substrate;
   when a wavelength specified by an electrode finger pitch of the IDT electrode is denoted as λ, the plurality of elastic wave resonators include at least two elastic wave resonators having different wavelengths λ;

in two of the plurality of elastic wave resonators having the different wavelengths $\lambda$, a film thickness of the IDT electrode in the elastic wave resonator having a longer wavelength $\lambda$ is equal to or smaller than a film thickness of the IDT electrode in the elastic wave resonator having a shorter wavelength $\lambda$;

film thicknesses of the IDT electrodes in at least two of the plurality of elastic wave resonators are different from each other; and the elastic wave device utilizes a Rayleigh wave.

2. The elastic wave device according to claim 1, wherein, in the two elastic wave resonators having the different wavelengths $\lambda$, the film thickness of the IDT electrode in the elastic wave resonator having the longer wavelength $\lambda$ is smaller than the film thickness of the IDT electrode in the elastic wave resonator having the shorter wavelength $\lambda$.

3. The elastic wave device according to claim 1, wherein
the plurality of elastic wave resonators include a first elastic wave resonator having a wavelength $\lambda$ that is longest among the plurality of elastic wave resonators and a second elastic wave resonator having a wavelength $\lambda$ that is shortest among the plurality of elastic wave resonators;

when the film thickness of the IDT electrode is denoted as t, a function of a band width ratio of an unwanted wave with respect to the film thickness t of the first elastic wave resonator is denoted a function F1(t) having a local minimum value, and a function of the band width ratio of the unwanted wave with respect to the film thickness t of the second elastic wave resonator is denoted as a function F2(t) having a local minimum value;

the function F1(t) has a minimum value F1(t1) at t=t1 in the first elastic wave resonator, and the function F2(t) has a minimum value F2(t2) at t=t2 in the second elastic wave resonator;

F1(tj)=F2(tj) is maintained at t=tj in the first elastic wave resonator and the second elastic wave resonator; and when, in the first elastic wave resonator, the film thickness of the IDT electrode at which a value of the function F1(t) is the same as a value of F1(tj) and t<t1 is maintained is denoted by t$\alpha$, and that, in the second elastic wave resonator, the film thickness of the IDT electrode at which a value of the function F2(t) is the same as a value of F2(tj) and t2<t is maintained is denoted by t$\beta$, the film thickness of the IDT electrode satisfies t$\alpha \leq$t<tj in the first elastic wave resonator and tj<t$\leq$t$\beta$ in the second elastic wave resonator.

4. The elastic wave device according to claim 1, wherein the dielectric film includes silicon oxide as a main ingredient.

5. The elastic wave device according to claim 1, wherein the dielectric film includes a first dielectric film, and a second dielectric film is disposed on the first dielectric film.

6. The elastic wave device according to claim 1, wherein the piezoelectric substrate is made of $LiNbO_3$.

7. The elastic wave device according to claim 1, wherein the piezoelectric substrate is made of a 126° to 130° Y cut $\lambda$SAW propagation $LiNbO_3$.

8. The elastic wave device according to claim 1, wherein the IDT electrodes are made of a multilayer metal film including a plurality of metal layers that are laminated.

9. The elastic wave device according to claim 1, wherein the IDT electrodes are made of a metal film including a single layer.

10. The elastic wave device according to claim 1, wherein the IDT electrodes made of Pt.

11. The elastic wave device according to claim 1, wherein each of the IDT electrodes has a duty ratio of about 0.5.

12. The elastic wave device according to claim 5, wherein the second dielectric film includes SiN as a main ingredient.

13. The elastic wave device according to claim 5, wherein the first dielectric film has a film thickness of about 650 nm, and the second dielectric film has a film thickness of about 20 nm.

* * * * *